United States Patent [19]

Sirinyan et al.

[11] Patent Number: 4,568,571
[45] Date of Patent: Feb. 4, 1986

[54] PROCESS FOR THE ADHESION-ACTIVATION OF POLYAMIDE SUBSTRATES FOR ELECTROLESS METALLIZATION

[75] Inventors: Kirkor Sirinyan, Bergisch Gladbach; Gerhard D. Wolf, Dormagen; Rudolf Merten; Ulrich von Gizycki, both of Leverkusen, all of Fed. Rep. of Germany

[73] Assignee: Bayer Aktiengesellschaft, Leverkusen, Fed. Rep. of Germany

[21] Appl. No.: 665,242

[22] Filed: Oct. 26, 1984

[30] Foreign Application Priority Data

Nov. 4, 1983 [DE] Fed. Rep. of Germany ....... 3339856

[51] Int. Cl.$^4$ ............................ B05D 3/04; B05D 3/10
[52] U.S. Cl. ...................................... 427/306; 427/304
[58] Field of Search ................................ 427/304, 306

[56] References Cited

U.S. PATENT DOCUMENTS 4,493,861  1/1985  Sirinyan et al. ..................... 427/304

FOREIGN PATENT DOCUMENTS 0081129  6/1983  European Pat. Off. .

*Primary Examiner*—James R. Hoffman
*Attorney, Agent, or Firm*—Sprung, Horn, Kramer & Woods

[57] ABSTRACT

A mild activation process for the adhesion-activation of polyamide mouldings for electroless metallization comprises treating the substrates, successively or simultaneously, with the solution of a mixture of $CaCl_2$, $LiCl$ and/or $MgCl_2$ with $AlCl_3$, $FeCl_3$ and/or $TiCl_4$ in a lower alcohol and with an activator solution based on inorganic complex compounds of the formula $$M^{n+}[E^{m+}Hal_z^-]$$

in which
  M represents two hydrogen or alkali metal atoms or one alkaline earth metal atom,
  Hal represents a halogen, preferably Cl, and
  E represents a noble metal atom of the 1st or 8th subgroup of the periodic table, having the valency m and the coordination number z $(z-m=n)$, or with customary colloidal or ionic systems of these noble metals.

7 Claims, No Drawings

PROCESS FOR THE ADHESION-ACTIVATION OF POLYAMIDE SUBSTRATES FOR ELECTROLESS METALLIZATION

It is generally known that the pretreatment, conventional for numerous plastic articles, by etching with strongly oxidising acids is unsuitable for polyamide substrates.

Proposals have therefore already been made (compare DE-A No. 2,946,343) first to pretreat the polyamide substrate at an elevated temperature with an aqueous alkaline solution having a pH value of at least about 10, before it is etched with an organic acid. For the last step, trichloroacetic acid and trifluoroacetic acid were preferably used, the handling of which requires expensive occupational health measures because of their volatility and high toxicity. Furthermore, this still very drastic pretreatment method causes an irreversible deterioration in the most important mechanical properties of the polyamide moulding.

According to DE-A No. 3,137,587, attempts are made to eliminate these disadvantages by pretreating the polyamide substrates with a mixture of water-containing acid and a water-soluble organic solvent having a swelling action on the polyamides. It was found, however, that even this etching process damages the polyamide mouldings to such an extent that the latter cannot be used for numerous purposes.

DE-A No. 2,022,109 describes a process for pretreating plastic mouldings to be metallised, which is characterised in that the plastic is treated, in a solvent which (incipiently) dissolves or incipiently swells it, with a dissolved metal salt complex. As a plastic, polyamide is also mentioned. The complex salts are essentially complexes of dimethyl sulphoxide with $LiCl$, $SnCl_2$, $ZnCl_2$, $FeCl_2$, $FeCl_3$, $Hg_2Cl_2$, $MnCl_2$, $AgNO_3$, and others. By way of example, only a silver nitrate solution containing ammonia is described as the activator solution. In repeating this method, however, only metal deposits of insufficient adhesive strength were obtained. Moreover, the substrates activated with $AgNO_3$ also frequently cause a breakdown of the metallisation baths.

It has now been found, surprisingly, that these disadvantages can be largely avoided and well adhering metal coatings on polyamide substrates can be obtained, without adversely affecting their mechanical properties, such as notched impact strength, impact resistance and mechanical strength, when the substrates are treated with (a) the solution of a mixture of $LiCl$, $CaCl_2$ and/or $MgCl_2$ with $AlCl_3$, $FeCl_3$ and/or $TiCl_4$ in a lower alcohol and (b) with an activator solution based on
  (1) inorganic complex compounds of the formula $$M^{n+}[E^{m+}Hal_z^-]$$

in which
  M represents two hydrogen or alkali metal atoms or one alkaline earth metal atom,
  Hal represents a halogen, preferably Cl, and
  E represents a noble metal atom of the 1st or 8th subgroup of the periodic table, preferably Pt and Pd, having the valency m and the coordination number z, with $z - m = n$, or
  (2) customary colloidal systems of these noble metals or
  (3) non-complex salts of these noble metals of the formula $$E^{m+}Hal_p^- (p=m)$$ successively or simultaneously, that is to say with a mixture of (a) and (b).

Preferred salt mixtures are $CaCl_2/AlCl_3$. Noble metal complexes, which are to be used preferably, are those of the formula $Na_2(PdCl_4)$, $Na_4(PtCl_6)$ and $Ca(PdCl_4)$.

Suitable colloidal noble metal systems are derived above all from the metals Pd, Pt, Au and Ag, and they are described, for example, in "Kunststoffgalvanisierung [Electroplating of Plastics]" by R. Weiner, Eugen G. Lenze Verlag, Saulgau/Württ. (1973), pages 180–209.

Suitable alcoholic solvents are: lower aliphatic and araliphatic alcohols, such as, for example methanol, ethanol, isopropanol, n-propanol, n-butanol, benzyl alcohol and phenylethyl alcohol. Methanol is particularly preferred. Of course, mixtures of these solvents can also be employed.

If desired, customary polyamide plasticisers (0.2–10% by weight, preferably 0.5–5% by weight, relative to the total quantity of liquid) can be added. As examples, benzenesulphonic acid monoethylamide, p-toluenesulphonic acid amide, dihydroxydiphenyl sulphone and dibenzylphenol may be mentioned.

The concentration of catalytically active metal in the treatment baths should be 0.01–10 g, preferably 0.1–1 g, per litre.

The total quantity of the salt mixtures to be used according to the invention is preferably 2.5–25% by weight (particularly preferably 5–15% by weight), relative to the quantity of liquid. The proportion of the Al, Fe and Ti salts mentioned should not exceed 30% (relative to the total quantity of salt, which can increase up to the particular solubility limit). Preferably, the proportion of these salts is 0.1–6%, in particular 0.5–3%.

The treatment of the substrates is in general carried out at a temperature from $-15°$ C. up to the boiling point of the solvents used, preferably 15°–30° C.

A preferred process variant consists in treating the substrate first with the activator solution containing the metal complex and then with the salt-containing, alcoholic swelling agent system or solvent system.

When carrying out this variant in practice, the procedure advantageously is that the polyamide moulding is immersed at room temperature in this swelling agent/activator system, removed from the bath after 0.5–10 minutes, preferably 1–5 minutes, freed from adhering solvent, then transferred into a sensitising bath and finally subjected to electroless metallisation.

The removal of the solvents is in general carried out by evaporation, if appropriate under reduced pressure. Higher-boiling solvents are advantageously removed by extraction or by washing with low-boiling solvents.

The sensitisation can in principle be carried out in the customary acid baths based on $SnCl_2$ and $ZnCl_2$ solutions. Preferably, however, it is carried out in alkaline baths with formalin, dimethylborane, sodium borohydride, hydrazine or sodium hydrogen hypophosphite. Sensitisation in ammonia-alkaline aqueous alcohol solutions (methanol, ethanol), which contain the abovementioned reducing agents, at room temperature for 1–5 minutes is very particularly preferred.

The sensitised surfaces can be introduced directly or after a washing step (in order to remove residues of reducing agent) into conventional metallising baths.

A very particularly preferred embodiment of the process according to the invention comprises carrying out the reduction in the metallising bath simultaneously by means of the reducing agent of the electroless metallisation. This embodiment represents a simplification, hitherto not possible, of electroless metallisation. This embodiment then consists only of the following working steps: immersion of the substrate into noble metal complex/swelling agent system, evaporation of the solvent and immersion of the surfaces thus activated into the metallising bath (reduction and metallisation).

This variant is very particularly suitable for nickel baths containing aminoborane or copper baths containing formalin.

The metal deposits produced in this way on the polyamide materials can, if desired, also be strengthened by electroplating. Cu, Ni, Cr, Ag, Au and Pt are above all suitable for this electrical metal deposition. In this case, it is advisable first to carry out pre-strengthening by electroplating up to layer thicknesses of about 20 μm in weakly acid or basic electroplating baths, for example in Ni baths at pH 5–6.

The process according to the invention is applicable to all commercially available polyamide types - such as polyamide 6, polyamide 6,6, polyamide 10, polyamide 11 and polyamide 12 as well as mixed types. Both polyamides containing fillers and unfilled polyamides can be treated equally successfully. Depending on the proportion, the filler admixtures shorten the required etching time, as compared with the unfilled polyamide.

Furthermore, extremely impact-resistant substrates, such as polyamides grafted on or mixed with rubber, polyisoprene or polybutadiene latices, are outstandingly suitable.

EXAMPLE 1

A glass fibre-reinforced (30% by weight) plastic plate of polyamide 6, of 90×150 mm size and 3 mm thickness, is adhesion-activated at room temperature (RT) for 5 minutes in an adhesion-nucleating bath which contains
1400 ml of methanol (technical, aqueous)
125 g of $CaCl_2$
2.0 g of $AlCl_3$
400 ml of distilled $H_2O$ and
3 g of $Na_2PdCl_4$ (about 15% of Pd)
and is dried. Subsequently, the plate is sensitised for 5 minutes at RT in a bath consisting of
1200 ml of ethanol (technical)
24 ml of $NH_3$ solution (25% strength)
50 ml of 2N DMAB (dimethylaminoborane),
rinsed with distilled water and then nickel-plated in a conventional hypophosphite-containing nickel-plating bath from Messrs. Blasberg AG, Solingen, for 25 minutes at 30° C. The adhesive strength of the metal deposit, determined by the peel strength according to DIN 53,494, is ≧60 N/25 mm. The strengthening of the abovementioned polyamide plate by electroplating for the determination of the peel strength was carried out as follows:
(a) pickling in 10% strength $H_2SO_4$ for half a minute
(b) rinsing
(c) 5 minutes in a semi-bright nickel-plating bath at a voltage of 9 volt and a bath temperature of 60° C.
(d) rinsing
(e) pickling for half a minute
(f) 90 minutes in a copper bath; voltage 1.9 volt, bath temperature 28° C.
(g) rinsing.

EXAMPLE 2

A plastic plate of commercially available rubber-grafted polyamide 6, of 90×150 mm size and 3 mm thickness, is treated for 7.5 minutes at 40° C. in an adhesion activation bath consisting of
120 g of $MgCl_2$
2.0 g of $FeCl_3$
125 ml of distilled $H_2O$
1400 ml of methanol
0.9 g of $PdCl_2$ (about 60% of Pd).
Subsequently, the plate is sensitised at room temperature in a solution of
900 ml of methanol
22 ml of hydrazine hydrate (30% strength solution)
15 ml of ammonia,
rinsed with distilled water and then strengthened by electroplating in accordance with Example 1. The metal deposit adheres very strongly to the plate surface. Its adhesive strength determined according to DIN 53,494 is 50 N/25 mm.

EXAMPLE 3

A moulding of rubber-modified polyamide 6 is treated for 7 minutes at room temperature in a solution of
1500 ml of methanol (technical, aqueous)
125 g of $CaCl_2$
4.0 g of $TiCl_4$
and then activated for 4 minutes in a commercially available colloidal Pd-containing activation bath containing hydrochloric acid, rinsed, sensitised in a commercially available sensitising bath containing $SnCl_2$ and nickel-plated in accordance with Example 1, or the metal deposit is strengthened by electroplating.

This gives a polymer/metal composite material having very good metal adhesion.

EXAMPLE 4

A plastic plate of a commercially available polyamide 6,6, of 90×150 mm size and 3 mm thickness, is treated at room temperature in an adhesion-activation bath consisting of
1500 ml of ethanol
120 g of $CaCl_2$
20 ml of p-toluenesulphonamide
3 g of $FeCl_3$
1.5 g of $PdCl_2$ (about 60% of Pd), dried, sensitised in accordance with Example 1 and then copper-plated for 25 minutes in a commercially available copper-plating bath, or the copper deposit is strengthened in accordance with Example 1 by electroplating means. This gives a metal/polymer composite material having very good adhesive strength.

EXAMPLE 5

In accordance with Example 1, a moulding consisting of a polyamide 6 reinforced with 30% by weight of glass fibres is treated, activated, sensitised, nickel-plated by the chemical method and then strengthened by electroplating. The strengthening by electroplating is carried out as follows:
(a) pickling in 10% strength $H_2SO_4$ for half a minute
(b) rinsing (c) 5 minutes in a semi-bright nickel-plating bath; voltage 4 volt, bath temperature 60° C., deposited semi-bright nickel layer: about 4 to 5μ
(d) rinsing
(e) pickling for half a minute
(f) 30 minutes in a copper bath, voltage 1.9 volt, bath temperature 28° C., applied copper layer of 15 to 16μ
(g) rinsing
(h) pickling for half a minute
(i) 8 minutes in a bright nickel bath, voltage 5.5 volt, bath temperature 52° C., deposited nickel layer of about 20μ
(j) rinsing
(k) immersion in oxalic acid (0.5% strength aqueous solution)
3 minutes in a bright chromium bath, voltage 4.5 volt, bath temperature 40° C., deposited chromium layer about 0.3μ
(m) rinsing
(n) decontamination in 40% bisulphite solution
(o) rinsing in distilled water.

The moulding thus metallised was subjected to the thermal cyclic test according to DIN 53,496, with the hot storage at +110° C. and the cold storage at −40° C. The metal deposit adheres so strongly to the surface of the moulding that it does not show any change.

EXAMPLE 6

A moulding of rubber-modified polyamide 6 is treated for 4 minutes at 25° C. in a solution of
1500 ml of methanol
100 g of $CaCl_2$
3 g of $BCl_3$
1.5 g of $PdCl_2$
3 g of $AlCl_3$
washed with distilled water, sensitised in accordance with Example 1, provided with an electrically conductive Ni deposit in accordance with Example 1, and the thin metal deposit is then strengthened by electroplating means in accordance with Example 5.

The moulding, thus provided with strongly adhering metallisation, was subjected to the thermal cycling test in accordance with Example 5. The metal deposit adheres so strongly to the surface of the moulding that it does not show any change.

EXAMPLE 7

A moulding consisting of a polyamide 6 reinforced with 40% by weight of mineral fibre is treated at 30° C. in a solution of
1000 ml of n-butanol
100 g of LiCl
25 g of $AlCl_3$
0.9 g of $H_2PtCl_6$ (about 40% of Pt),
sensitised in accordance with Example 1 and nickel-plated in accordance with Example 1, and the Ni deposit is then electroplated in accordance with Example 5. The metal deposit adheres so strongly to the surface of the moulding that it passes the thermal cycling test according to DIN 53,496.

EXAMPLE 8

A plastic plate consisting of polyamide 6 reinforced with 40% by weight of mineral fibre, of 90×150 mm size and 3 mm thickness, is adhesion-activated in a solution in accordance with Example 1, sensitised, nickel-plated and then electroplated. This gives a polymer/metal composite material, the adhesive strength of which is 50 N/25 mm, determined by means of the peel strength according to DIN 53,494.

EXAMPLE 9

7 standard rods of a polyamide 6 blended with 30% of rubber are, in accordance with Example 1, pretreated, sensitised and chemically nickel-plated. The impact resistance examinations according to DIN 53,453/ISO R 179 show that their impact resistance is not affected by the entire metallisation process.

EXAMPLE 10

7 standard rods of a commercially available polyamide 6 reinforced with 40% of mineral fibres and rubber-modified are adhesion-activated in accordance with Example 6 and then metallised. This gives test specimens with a firmly adhering metal deposit. The impact resistance examinations according to DIN 53,453/ISO R 179 show that their impact resistance is not affected by the adhesion-activation process and nickel-plating process.

EXAMPLE 11

A glass fibre-reinforced (30% by weight) plastic plate of polyamide 6, of 90×150 mm size and 3 mm thickness, is treated for 7 minutes at 27.5° C. in a pretreatment bath which contains
1500 ml of methanol (technical, aqueous)
125 g of $CaCl_2$
5 g of $AlCl_3$,
washed with distilled water, activated for 5 minutes at room temperature in an activation solution consisting of
1000 ml of ethanol
0.4 g of $PdCl_2$,
rinsed with distilled water and then sensitised, or nickel-plated, in accordance with Example 1. This gives a metal/polymer composite material having very good adhesive strength.

We claim:
1. Process for the adhesion-activation of substrate surfaces of polyamide mouldings for electroless metallisation, characterised in that the substrates are treated, successively or simultaneously, with
(a) the solution of a mixture of $CaCl_2$, LiCl and/or $MgCl_2$ with $AlCl_3$, $FeCl_3$ and/or $TiCl_4$ in a lower alcohol and
(b) with an activator solution based on
(1) inorganic complex compounds of the formula

$$M^{n+}[E^{m+}Hal_z{}^-]$$

in which
M represents two hydrogen or alkali metal atoms or one alkaline earth metal atom,
Hal represents a halogen, preferably Cl, and
E represents a noble metal atom of the 1st or 8th subgroup of the periodic table, having the valency m and the coordination number z, with z−m=n, or
(2) colloidal systems of these noble metals or
(3) non-complex salts of these noble metals of the formula $$E^{m+}Hal_p{}^- (p=m)$$

2. Process according to claim 1, characterised in that the substrates thus treated are introduced directly into the metallising baths.

3. Process according to claim 1, characterised in that a mixture of $CaCl_2$ and $AlCl_3$ is used.

4. Process according to claim 1, characterised in that the pretreatment is carried out with a solution of $CaCl_2$ and $AlCl_3$ in methanol.

5. Process according to claim 1, characterised in that the pretreated substrates are treated in an ammonia-alkaline metallising bath containing aminoborane or containing formalin.

6. Process according to claim 1, characterised in that the activator solutions used are those based on complex compounds.

7. Process according to claim 1, characterised in that Pd, Pt, Au or Ag are used as the noble metals.

* * * * *